United States Patent
Cho et al.

(10) Patent No.: US 6,841,493 B2
(45) Date of Patent: Jan. 11, 2005

(54) HIGH K GLASS AND TAPE COMPOSITION FOR USE AT HIGH FREQUENCY

(75) Inventors: Yong Cho, Apex, NC (US); Kenneth Warren Hang, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 103 days.

(21) Appl. No.: 10/390,107

(22) Filed: Mar. 17, 2003

(65) Prior Publication Data

US 2004/0009864 A1 Jan. 15, 2004

Related U.S. Application Data

(60) Provisional application No. 60/385,703, filed on Jun. 4, 2002.

(51) Int. Cl.[7] .............................. C03C 14/00; C03C 3/15
(52) U.S. Cl. .............................. 501/32; 501/46; 501/47; 501/51; 428/434
(58) Field of Search .............................. 501/32, 46, 47, 501/51, 23; 428/434

(56) References Cited

U.S. PATENT DOCUMENTS

| | | | |
|---|---|---|---|
| 6,147,019 A | 11/2000 | Donohue | 501/50 |
| 6,217,821 B1 | 4/2001 | Donohue | 264/619 |
| 6,776,861 B2 * | 8/2004 | Wang et al. | 156/89.11 |

FOREIGN PATENT DOCUMENTS

| | | |
|---|---|---|
| EP | 0 577 067 B1 | 2/2000 |
| JP | 10-120435 | 5/1998 |
| WO | WO 02/18285 A1 | 3/2002 |

OTHER PUBLICATIONS

O. Dernovsek, A. Naeini, G. Preu, W. Wersing, M. Eberstein, W. A. Schiller, LTCC glass–ceramic composites for microwave application, Journal of the European Ceramic Society 21 (2001) 1693–1697.

* cited by examiner

Primary Examiner—Karl Group

(57) ABSTRACT

The present invention is directed to a glass composition comprising, based on mole %, 15–35% MO where M is selected from BaO, CaO, MgO, PbO, SrO and mixtures thereof, 30–60% $TiO_2$, 10–30% $B_2O_3$, 1–7% $P_2O_5$, 0–3% $Li_2O$ and 2–16% $Ln_2O_3$ where Ln is selected from the group of rare earth elements and mixtures thereof. The invention is further directed to the glass composition incorporated in a thick film composition or a castable dielectric composition comprising a dispersion of finely divided solids comprising, based on solids: (a) 30–100 wt. % the glass composition; (b) 0–50 wt. % ceramic filler; both dispersed in a solution of (c) an organic polymeric binder; and (d) a volatile organic solvent. The invention is still further directed to the castable dielectric composition used in a method of forming a high K green tape by casting a thin layer of the castable dispersion onto a flexible sheet and heating the cast layer to remove the volatile organic solvent.

15 Claims, No Drawings

HIGH K GLASS AND TAPE COMPOSITION FOR USE AT HIGH FREQUENCY

FIELD OF THE INVENTION

The invention is directed to high dielectric constant (K) glass compositions for use in thick film compositions and castable tape compositions for fabrication of multilayer circuits designed to operate at high frequencies.

BACKGROUND OF THE INVENTION

As the number and complexity of wireless applications grow, there is increasing need for circuits designed to operate at high frequencies, i.e., in the RF and microwave frequency range (300 kHz to 300 GHz) for audio, visual, and data transmissions. Circuit materials are needed which combine low dielectric and conductor losses in this frequency range. In particular, a high dielectric constant (K>15) has been required to reduce device size and/or increase capacitance density. Low temperature co-fired ceramic (LTCC) tape is a well-known technology for combining a high conducting metallization (silver and gold) with reliable ceramic dielectric layers for dense packaging of IC circuits. The LTCC tape has been used as a ceramic substrate for multilayer interconnects incorporating various passive components. The majority of present LTCC systems are composed of glass and ceramic filler. Glass is an important part, giving specific functions such as high K and low loss at high frequency. Ceramic fillers usually impart high strength and dimensional stability.

The present invention provides new glass chemistries that exhibit a high dielectric constant (K>15). The resultant glass-ceramic body after firing exhibits good strength with silver and gold compatibility. In addition, the new glasses allow for low temperature firing, i.e., below the melting point of silver which broadens the processing latitude of existing systems.

SUMMARY OF THE INVENTION

The present invention relates to a glass composition comprising, based on mole %, 15–35% MO where M is selected from BaO, CaO, MgO, PbO, SrO and mixtures thereof, 30–60% $TiO_2$, 10–30% $B_2O_3$, 1–7% $P_2O_5$, 0–3% $Li_2O$ and 2–16% $Ln_2O_3$ where Ln is selected from the group of rare earth elements and mixtures thereof.

The invention is further directed to the glass composition incorporated in a thick film composition or a castable dielectric composition comprising a dispersion of finely divided solids comprising, based on solids: (a) 30–100 wt. % the glass composition; (b) 0–50 wt. % ceramic filler; both dispersed in a solution of (c) an organic polymeric binder; and (d) a volatile organic solvent.

The invention is still further directed to the castable dielectric composition used in a method of forming a high K green tape by casting a thin layer of the castable dispersion onto a flexible sheet and heating the cast layer to remove the volatile organic solvent.

DETAILED DESCRIPTION OF THE INVENTION

Circuit materials that make up the thick film compositions and castable tape compositions of this invention are free of elements, such as Pb and Cd, which are on the EPA hazardous waste list. This invention is based on the compositions exhibiting high K and can be made with rare earth glasses. The new barium titanate borate glasses are $SiO_2$-free as opposed to presently known common borosilicate glasses. The borate glasses used in the castable dielectric compositions may contain several additives, for example, $P_2O_5$, which improves the stability of the melt, and/or alkali oxides such as $Li_2O$, which serves to lower glass viscosity.

The invention also extends to the use of the glasses in circuit materials such as thick film compositions and ceramic tapes. Descriptions of the main components of the thick film compositions and tapes follow.

Glass

The borate glasses discussed herein exhibit high K in the GHz frequencies. A filler may or may not be used. The main components of the glasses, based on mole % are: 15–35% MO where M is selected from BaO, CaO, MgO, PbO, SrO and mixtures thereof, 30–60% $TiO_2$, 10–30% $B_2O_3$, 1–7% $P_2O_5$, 0–3% $Li_2O$ and 2–16% $Ln_2O_3$ where Ln is selected from the group of rare earth elements and mixtures thereof.

The glasses described herein a produced by conventional glass making techniques. The glasses were prepared in 500–1000 gram quantities. Typically, the ingredients are weighted then mixed in the desired proportions and heated in a bottom-loading furnace to form a melt in platinum alloy crucibles. As well known in the art, heating is conducted to a peak temperature (1400–1600° C.) and for a time such that the melt becomes entirely liquid and homogeneous. The glass melts were then quenched by counter rotating stainless steel roller to form a 10–20 mil thick platelet of glass. The resulting glass platelet was then milled to form a powder with its 50% volume distribution set between 1–5 microns. The glass powders were then formulated with filler and medium as detailed below.

In the discussion following BaO is used to represent the group MO in a glass composition of the present invention. The glass crystallizes upon firing, leading to a glass-ceramic structure. According to a x-ray diffraction study, well-known stoichiometric perovskite $BaTiO_3$ phase was not identified as a major crystalline phase when the glasses were fired at 850° C. An observed crystalline phase was based on non-stoichiometric phases consisting of Ba, Ti, Nd and O. Two major phases, $BaNd_2Ti_3O_{10}$ and $BaNd_2Ti_4O_{12}$, were found with many unknown crystalline phases when fired at 850° C. The crystalline phases contribute to the high K characteristics of the glasses. Dielectric constants vary depending on the amount and type of the crystalline phases, indicating sufficient presence of Ba and Ti in the glasses is needed.

For a more general discussion of the glass, when the total amount of MO and $TiO_2$ is above 45 mole % in the glass composition, the resulting dielectric constant of the glasses show a K value higher than 15 at 1 MHz. The dielectric constant also varies in a generally non-predictive manner with changing ratio between MO and $TiO_2$. The existence of rare earth elements in the glass improved dielectric loss, especially at high frequencies above 1 GHz. Therefore, a higher content of rare earth elements is preferred to yield a lower loss at high frequencies. The content of rare earth elements is limited to about 16 mole % due to the poorer quenching stability of the glass at higher additions. As the rare earth element is added, more glass formers such as $B_2O_3$ and $P_2O_5$ are needed to maintain stable glass formation. The glass formers influence the physical performance of the resulting glass by modifying the softening behavior of the glass. The annealing temperature of the glass is near 650° C., while the softening point is not easily measured in a crystallizable glass. The content of MO tends to lower the densification temperature and increase the densification kinetics. Therefore, a higher content of MO is preferred.

The glasses described in this section are generally limited to the components described above. However the presence of minor amounts of compatible metal oxides may be tolerated to modify the melting behavior of the glass and/or the physical properties thereof. However the total of all such additions should not exceed about 10%. Examples of such additions include minor amounts of $Na_2O$ and/or $K_2O$ to soften the glass. The glass is formulated with sufficient durability in water for tape stability and for low cost water milling.

The use of colorant oxides with the glass in a tape formulation, may be used to modify the appearance of the fired tape but may produce unwanted effects on the dielectric characteristics of the tape. In addition, the colorant may be deleterious to the high frequency properties of the fired tapes. Examples of such oxides are CuO, Fe oxides, NiO, Mn oxides, or Cr oxides etc. The addition of these oxides is generally limited to 0–2% in a formulation.

The glass described herein is compatible with co-fired silver conductors. The glass must proceed quickly to mature its glass and crystalline microstructure (shorter flow period) when firing or it will interact with the silver metallization and will not allow solder wetting. Solder wetting is an important feature allowing connection of a ceramic circuit to external wiring such as on a printed circuit board. For further silver compatibility, the co-fired silver should not stain the ceramic. Commonly glasses high in $B_2O_3$ show a halo due to migration of $Ag^{+1}$ through the borate glass structure. The glass described herein does not show silver stains around co-fired silver conductors.

Green Tape Composition

The tape of the present invention contains the novel glasses as described above, which contribute to the high K characteristic of the tape. The phrase "high K" is defined by its high dielectric constant above 15 at a certain measuring frequency. The frequency range for this K can be between approximately 10 Hz to 20 GHz, as the characteristic property is generally flat with frequency when the crystalline phase is paraelectric.

To determine the high K characteristic of the tape the following test was used. Low frequency dielectric characteristics were evaluated using an impedance analyzer (Hewlett Packard 4192A) within the frequency range of 1 kHz to 13 MHz. For the high frequency dielectric measurement, the transmission response of a 50 Ohms microstrip T-pattern resonator was measured using a Hewlett Packard 8510B Microwave Network Analyzer. The resonant frequency and the 3 dB bandwidth of the response were recorded and used to calculate the high frequency dielectric constant and loss. The T-pattern resonator sample was prepared on the tape by post-firing a printed Ag conductor and ground planes.

The current invention may not require a filler in some applications, for example, a buried capacitor sandwiched between other low K LTCC tapes. The glass itself forms a glass-ceramic structure during firing by forming crystalline phases, which leading to a high K and a sufficient mechanical strength. However, a ceramic filler such as $Al_2O_3$, $ZrO_2$, $TiO_2$, $BaTiO_3$ or mixtures thereof may be added to the castable dielectric composition in an amount of 0–50 wt. % based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts partially with the glass to form an Al-containing crystalline phase or to modify the sintering behavior of tape. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, a quartz, $CaZrO_3$, mullite, cordierite, forsterite, zircon, zirconia, $CaTiO_3$, $MgTiO_3$, $SiO_2$, amorphous silica or mixtures thereof may be used to modify tape performance and characteristics.

In the formulation of tape compositions, the amount of glass relative to the amount of ceramic material is important. A filler range of 20–40% by weight is considered desirable in that the sufficient densification is achieved. If the filler concentration exceeds 50% by wt., the fired structure is not sufficiently densified and is too porous. Within the desirable glass/filler ratio, it will be apparent that, during firing, the liquid glass will become saturated with filler material.

For the purpose of obtaining higher densification of the composition upon firing, it is important that the inorganic solids have small particle sizes. In particular, substantially all of the particles should not exceed 15 $\mu$m and preferably not exceed 10 $\mu$m. Subject to these maximum size limitations, it is preferred that at least 50% of the particles, both glass and ceramic, be greater than 1 $\mu$m and preferably in the 2–7 $\mu$m range.

The organic medium in which the glass and ceramic inorganic solids are dispersed is comprised of the polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 20% wt. polymer binder and 80% wt. ceramic solids. Within these limits, it is desirable to use the least possible amount of binder vis-à-vis solids in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly (vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacyrlic acid have been previously used as binders for slip casting materials.

U.S. Pat. No. 4,536,535 to Usala issued Aug. 20, 1985 has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the polymers permit the use of minimum amounts of binder and maximum amounts of dielectric solids, their use is preferred with the dielectric composition of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers is, of course, determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

A particularly preferred solvent is ethyl acetate since it avoids the use of environmentally hazardous chlorocarbons.

In addition to the solvent and polymer, a plasticizer is used to impart workability in cutting laminating. A preferred plasticizer is BENZOFLEX® 400 which is a polypropylene glycol dibenzoate.

A green tape is formed by casting a thin layer of a slurry dispersion of the glass, polymeric binder and solvent as described above onto a flexible substrate, heating the cast layer to remove the volatile solvent and then separating the solvent-free layer from the substrate. The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace or in a box furnace with a programmed heating cycle forming a fired article.

As used herein, the term "firing" means heating the article in an oxidizing atmosphere such as air to a temperature and for a time sufficient to volatilize (burn-out) the organic material in the layers of the assemblage to sinter any glass, metal or dielectric material in the layers and thus densify the dielectric layer.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

Thick Film Composition

The glass of the invention may also be used in thick film compositions. Thick film compositions are established compositions for manufacturing electrical components. When a thick film composition is applied by screen-printing, the particles thereof are mixed with an inert liquid medium (vehicle) by mechanical mixing (e.g., on a roll mill) to form a pastelike composition having suitable consistency and rheology for screen printing. The latter is printed as a "thick film" in the conventional manner.

The main purpose of the organic medium is to serve as a vehicle for dispersion of the finely divided solids of the composition in such form that it can readily be applied to ceramic or other substrates. Thus the organic medium must first of all be one in which the solids are dispersible with an adequate degree of stability. Secondly, the Theological properties of the organic medium must be such that they lend good application properties to the dispersion.

Most thick film compositions are applied to a substrate by means of screen-printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°–350° C.

Suitable solvents include kerosene, mineral spirits, dibutylphthalate, butyl carbitol, butyl carbitol acetate, hexylene glycol and high boiling alcohols, alcohol esters and terpineol. Various combinations of these and other solvents are formulated to obtain the desired viscosity and volatility.

By far the most frequently used and a frequently preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate and polyalpha methystyrene can also be used. The invention extends itself to water-based systems since the glass is water millable. Resins suitable for water-based systems are: polyvinylpyrrolidone, copolymers with PVA, hydroxyethylcellulose, methylcellulose, hydroxypropylcellulose, sodium carboxymethylcellulose, polyvinylacetate, and neutralized acrylic polymers. Suitable co-solvents suitable for water-based systems are: butyl cellosolve, tetraethylene glycol, butyl carbitol, butyl carbitol acetate, ethylene glycol, glycerol, ethylene glycol diacetate, carbitol acetate, n-methyl pyrolidone, hexylene glycol, diproplyleneglycol monomethly ether, 1-methoxy-2-propanol acetate, propylene glycol phenyl ether, and dipropylene glycol phenyl ether.

Among the thixotropic agents which are commonly used is hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used; i.e., determined mainly by the final desired formulation viscosity and print thickness. Normally, to achieve good coverage, the dispersions will contain complementary by weight 40–90% solids and 60–10% organic medium.

It will be recognized that by adjusting the rheological properties of the dispersions of the invention and by changing the solvent component of the organic medium, the invention compositions can be applied to substrates by other methods than casting, e.g., by screen printing. When the compositions are applied by screen printing, the conventional organic media materials used for thick film materials can be used so long as the polymers are completely soluble therein at application temperatures.

The present invention will be described in further detail by giving practical examples. The scope of the present invention, however, is not limited in any way by these practical examples.

EXAMPLES

Example 1

Glass was prepared of composition in mole %: BaO 28.5; $TiO_2$ 36.5; $Nd_2O_3$ 13; $B_2O_3$ 15.5; $P_2O_5$ 5.5; $Li_2O$ 1 by mixing ingredients and heating in a platinum crucible at 1500° C. The melt was mixed and quenched into water. It was milled in water and hot air dried. The average particle size of the resultant glass frit was 6 $\mu m +/- 1$ $\mu m$. Tape was prepared using various ratios of glass/alumina filler until the point of full densification was achieved yet without excessive glass to keep dielectric constant high and dielectric loss low at GHz frequency. At this particle size, tape was prepared by dispersing powders: 73 g glass and 27 g $Al_2O_3$ in ethyl acetate solvent with methyl methacrylate, methacrylic acid copolymer binder and plasticizer. The slip was cast on a Mylar sheet and dried to form a tape. The tape was cut, laminated, printed with thick film silver and fired in a conventional profile with an 850° C./10 min peak. The ceramic fired dense with about 13% x,y shrinkage and showed no stain with co-fired silvers. The co-fired silvers and palladium-silver showed good wetting of conventional solder. The final tape also showed good dimensional stability and no distortion or cracks along the pattern of co-fired Ag or Pd/Ag. This is a major benefit which can be used for the stand alone LTCC application.

Low frequency dielectric characteristics were evaluated using an impedance analyzer (Hewlett Packard 4192A) within the frequency range of 1 kHz to 13 MHz. To measure dielectric constant at high frequency, a 50 Ω strip pattern was prepared on the tape by post-firing a silver conductor and ground planes. Measurements were made using a Hewlett Packard 8510B Microwave Network Analyzer. The resulting dielectric constant was near 21 in the range of 1 GHz to 10 GHz. No significant variation in the dielectric constant was observed over the frequency range.

TABLE 1

| | Glass composition in mole % | | | | | | | | | | | | |
|---|---|---|---|---|---|---|---|---|---|---|---|---|---|
| Ex # | 1 | 2 | 3 | 4 | 5 | 6 | 7 | 8 | 9 | 10 | 11 | 12 | 13 |
| BaO | 28.5 | 19 | 29 | 21 | 27 | 30 | 28 | 17 | 29 | 29.5 | 15.8 | 17.1 | 17.1 |
| $TiO_2$ | 36.5 | 54 | 39 | 44 | 36.5 | 36 | 46 | 57 | 46.5 | 47.5 | 54 | 58.3 | 58.3 |
| $Nd_2O_3$ | 13 | 12 | 12 | 16 | 14 | 16 | 8 | 8 | 8 | 8 | | | |
| $B_2O_3$ | 15.5 | 11 | 15 | 13 | 15.5 | 13 | 11 | 12 | 11 | 11 | 11.1 | 12 | 12 |
| $P_2O_5$ | 5.5 | 4 | 5 | 5 | 6 | 5 | 4 | 3 | 4 | 4 | 2.8 | 3 | 3 |
| $Li_2O$ | 1 | | | 1 | 1 | | | | 1 | | | | |
| $ZrO_2$ | | | | | | 3 | | | | | | | |
| $V_2O_5$ | | | | | | | | 3 | | | | | |
| CuO | | | | | | | | | 0.5 | | | | |
| $Bi_2O_3$ | | | | | | | | | | | 1.4 | 1.5 | 1.5 |
| $WO_3$ | | | | | | | | | | | 14.9 | | |
| $Sm_2O_3$ | | | | | | | | | | | | 8.1 | |
| $La_2O_3$ | | | | | | | | | | | | | 8.1 |

TABLE 2

| | Ceramic tape composition in wt % based on solids | | | | | | | | | | | | | |
|---|---|---|---|---|---|---|---|---|---|---|---|---|---|---|
| Ex. # | 14 | 15 | 16 | 17 | 18 | 19 | 20 | 21 | 22 | 23 | 24 | 25 | 26 | 27 |
| Glass Ex. # | 1 | 1 | 2 | 2 | 2 | 3 | 4 | 5 | 6 | 7 | 8 | 9 | 10 | 10 |
| Glass | 73 | 73 | 70 | 70 | 70 | 73 | 73 | 73 | 73 | 80 | 88 | 80 | 70 | 70 |
| $Al_2O_3$ | 25 | 23 | 30 |  | 27 | 27 | 27 | 27 | 25 | 20 | 12 | 20 | 30 | 23 |
| $ZrO_2$ |  |  |  | 30 |  |  |  |  |  |  |  |  |  |  |
| $TiO_2$ |  |  |  |  |  |  |  |  | 2 |  |  |  |  |  |
| $Nd_2O_3$ | 2 | 4 |  |  | 3 |  |  |  |  |  |  |  |  | 7 |
| Dielectric constant | | | | | | | | | | | | | | |
| Frequency | | | | | | | | | | | | | | |
| 1 MHz | 22.9 | 24.6 | 20.5 | 22.2 | 17.7 | 22.7 | 23.0 | 21.0 | 17.7 | 19.1 | — | 23.5 | 21.9 | 19.3 |
| 3 GHz | 23.2 | 24.3 | 19.8 | — | — | 23.6 | 23.2 | 21.5 | 16.7 | — | — | — | 22.5 | 19.0 |
| 10 GHz | 23.1 | 24.5 | 19.8 | — | — | 23.4 | 23.4 | 21.6 | 16.9 | — | — | — | 22.7 | 18.8 |

Examples 2–11

Examples 2–11 as shown in Table 1 denote glass compositions of the present invention. Glasses are prepared according to conventional glass making techniques as described in Example 1. In addition to the base glass components, $ZrO_2$, $V_2O_5$, $CuO$ and $WO_3$ were incorporated into the high K glass. All glasses were successfully melted at >1450° C. and quenched without crystallization.

Examples 12, 13

Examples 12 and 13 show the use of other rare earth elements such as lanthanum and samarium in the barium titanate borate glass. The two glasses were successfully melted at >1450° C. and quenched without crystallization.

Examples 14–27

In Examples 14–27 the ceramic green tape was prepared by mixing the glass found in Table 1 with polymer, plasticizer, and solvent as described in Example 1 and fillers as found in Table 2. Therefore, Table 2 discloses tape compositions utilizing the glasses of Table 1. Crystalline phases based on the Nd—Ba—Ti—O system formed by firing laminated and printed parts at a peak temperature of 850° C. in a conveyor furnace. Dielectric properties were measured at low and high frequencies ranging from a few kHz to a few GHz. Solderability of co-fired silver and Pd/Ag thick film parts were tested. All tape compositions showed good solderability and no stains with a Pd/Ag conductor.

Table 2 also shows dielectric constants at certain frequencies for the tape compositions listed in the same table. The dielectric constant ranged from 15 to 25, depending on glass, filler type and content. No significant change in dielectric constant was observed regardless of tape composition and frequency.

Dielectric loss was found related to the content of neodymium in the high K glasses. The higher content of neodymium tended to have lower loss at GHz. For example, the Example 19 tape containing 12 mole % $Nd_2O_3$ in glass showed a higher dielectric loss of 0.008 at 3 GHz compared to 0.006 obtained for the Example 20 tape containing 16 mole % $Nd_2O_3$ in glass. Regardless of tape composition in Table 2, the dielectric loss moderately increased with increasing frequency in the range of 1 GHz to 10 GHz.

Example 28, 29

This Example shows the effect of $BaTiO_3$ filler addition to the tape composition. Tapes (in wt % based on solids) were prepared:

| Ex. # | 28 | 29 |
|---|---|---|
| Glass Ex. # | 2 | 2 |
| Glass | 80 | 70 |
| $BaTiO_3$ filler | 20 | 30 |
| Dielectric constant | | |
| 1 MHz | 46 | 65 |

The dielectric constant of the tapes significantly increased by using the filler of $BaTiO_3$. The value proportionally depends on the content of $BaTiO_3$.

Examples 30–32

Tapes were prepared with a variation in the ceramic $Al_2O_3$ content. The results show that the increase in the $Al_2O_3$ content decreased dielectric constant due to the diluting effect of dielectric constant with increasing low K alumina. Fired x,y shrinkage of the tapes also depended on the alumina content, but an optimum amount of alumina was found to exist for best densification of tape.

| Ex. # | 30 | 31 | 32 |
|---|---|---|---|
| Glass Ex. # | 2 | 2 | 2 |
| Glass | 90 | 80 | 60 |
| $Al_2O_3$ | 10 | 20 | 40 |
| Dielectric constant | | | |
| 1 MHz | 28 | 25 | 15 |
| Fired x, y shrinkage (%) | 11.9 | 12.4 | 4.7 |

What is claimed is:

1. A glass composition comprising, in mole %, 15–35% MO where M is selected from BaO, CaO, MgO, PbO, SrO and mixtures thereof, 30–60% $TiO_2$, 10–30% $B_2O_3$, 1–7% $P_2O_5$, 0–3% $Li_2O$ and 2–16% $Ln_2O_3$ where Ln is selected from the group of rare earth elements and mixtures thereof.

2. The composition of claim 1 wherein Ln is selected from Nd, Sm, La and mixtures thereof.

3. The composition of claim 1 wherein the amount of MO, $TiO_2$, $B_2O_3$ and $Ln_2O_3$ is above 57 mole % in the total glass composition.

4. The composition of claim 1 wherein the glass exhibits a dielectric constant higher than 15.

5. A dielectric composition comprising a dispersion of finely divided solids comprising, based on solids:
  (a) 30–100 wt. % the glass composition as in any one of claims 1–4;
  (b) 0–70 wt % ceramic filler;
  (c) an organic polymeric binder; and
  (d) a volatile organic solvent.

6. The castable dielectric composition of claim 5 wherein the ceramic filler comprises 20–40 wt. % of the composition.

7. The dielectric composition of claim 5 wherein the ceramic filler is selected from $Al_2O_3$, $ZrO_2$, $TiO_2$, $BaTiO_3$, and mixtures thereof.

8. A green tape processed by casting a thin layer of the dispersion of claim 5 onto a flexible sheet, heating the cast layer to remove the volatile organic solvent forming a solvent-free layer.

9. The green tape of claim 8 wherein the solvent-free layer is separated from the flexible sheet.

10. The tape of claim 8 wherein a Ag conductor composition is deposited on the tape.

11. The tape of claim 9 wherein a Ag conductor composition is deposited on the tape.

12. The tape of claim 8 used in a multilayer microcircuit application designed to operate at high frequency.

13. The tape of claim 9 used in a multilayer microcircuit application designed to operate at high frequency.

14. An article comprising the tape of claim 8 wherein the tape was processed to volatilize organic polymeric binder and sinter the glass composition.

15. An article comprising the tape of claim 9 wherein the tape was processed to volatilize organic polymeric binder and sinter the glass composition.

* * * * *